(12) United States Patent
Markle

(10) Patent No.: US 6,833,908 B2
(45) Date of Patent: Dec. 21, 2004

(54) COMPUTER ARCHITECTURE FOR AND METHOD OF HIGH-RESOLUTION IMAGING USING A LOW-RESOLUTION IMAGE TRANSDUCER

(75) Inventor: David A. Markle, Saratoga, CA (US)

(73) Assignee: Ultratech, Inc., San Jose, CA (US)

(*) Notice: Subject to any disclaimer, the term of this patent is extended or adjusted under 35 U.S.C. 154(b) by 556 days.

(21) Appl. No.: 09/816,800

(22) Filed: Mar. 23, 2001

(65) Prior Publication Data

US 2002/0171816 A1 Nov. 21, 2002

(51) Int. Cl.[7] .......................... G03B 27/32; G03B 27/42
(52) U.S. Cl. ..................................... 355/77; 355/53
(58) Field of Search .............................. 355/53, 67–71, 355/77; 359/223–224, 618–620; 250/492.2

(56) References Cited

U.S. PATENT DOCUMENTS

| | | | |
|---|---|---|---|
| 4,566,935 A | | 1/1986 | Hornbeck .................... 156/626 |
| 5,691,541 A | | 11/1997 | Ceglio et al. ............ 250/492.1 |
| 6,060,224 A | * | 5/2000 | Sweatt et al. ................ 430/395 |
| 6,498,685 B1 | * | 12/2002 | Johnson ....................... 359/626 |
| 6,509,955 B2 | * | 1/2003 | Mei et al. ....................... 355/53 |

OTHER PUBLICATIONS

Mignardi, Michael A, Digital Micromirror Array for Projection TV, Jul. 1994, Solid State Technology, pp 63–68.

* cited by examiner

Primary Examiner—Henry Hung Nguyen
(74) Attorney, Agent, or Firm—Allston L. Jones

(57) ABSTRACT

Architecture and method to transfer data in generation, display or printing high edge placement accuracy images from multiple exposure of plurality of predefined patterns with lower edge placement accuracy. A pattern is laid out on a grid finer or different from grid size of image transducer pixel size, overlaid by transducer grid and converted to n patterns compatible with transducer grid. When combined by partial exposures weighting patterns unevenly, the n patterns generate an image with line edge positions a fraction ($1/(2^n-1)$) of transducer grid size. For most picture display and step-and-repeat lithography applications, pattern stored in first memory is displayed or partially exposed once, and remaining patterns are displayed or partially exposed $2^{m-1}$ times m being copy number of the pattern. Superimposing $2^n-1$ exposures in human eye to scene integration time, picture with improved line placement accuracy is perceived.

7 Claims, 11 Drawing Sheets

| 216a<br>3/16 x 31 = 6<br><br>(2 + 4) | 3  216b<br>10/16 x 31 = 19<br><br>(1 + 2 + 16) | 216c<br>4/16 x 31 = 8<br><br>(8) |
|---|---|---|
| 216d<br>10/16 x 31 = 19<br><br>(1 + 2 + 16) | 216e<br>16/16 x 31 = 31<br><br>(1 + 2 + 4 + 8 + 16) | 216f<br>14/16 x 31 = 27<br><br>(1 + 2 + 8 + 16) |

Fig. 7

COMPUTER ARCHITECTURE FOR AND METHOD OF HIGH-RESOLUTION IMAGING USING A LOW-RESOLUTION IMAGE TRANSDUCER

FIELD OF THE INVENTION

The present invention relates to the generation and display of images or the recording of patterns for reconstruction using an image transducer, and in particular relates to a computer architecture for and method of generating and displaying images or recording patterns that exhibit line edge placement accuracy to a fraction of the pixel size of the image transducer.

BACKGROUND OF THE INVENTION

A system for a maskless lithography system employing a flashing (pulsed) radiation source, an array of micro-mirror chips each having a programmable two-dimensional array of adjustable micro-mirrors, and a continuously scanning stage for supporting a wafer to be exposed is described in U.S. Pat. No. 5,691,541 ("the '541 patent"), which patent is incorporated herein by reference. An example of a digital micro-mirror device (DMD) suitable for such a lithography system is described in U.S. Pat. No. 4,566,935, and in an article by Mignardi, entitled "Digital micro-mirror Array for Projection TV," Solid State Technology, July 1994, pg. 63.

In the system of the '541 patent, each DMD in the array is programmed so that a binary (black or white) array pattern is formed, with each micro-mirror in each DMD constituting a pixel. The pattern is briefly illuminated by a flashing radiation source. Radiation reflected from the DMD array is projected through a projection optical system to a substrate located on the scanning stage. The flashing radiation source produces a very short pulse with a relatively long time between pulses. For example, for an excimer laser light source, the temporal pulse length of the flash may be less than 30 ns and the repetition rate may be up to 5000 Hz. Each flash results in a partial exposure of the pattern onto the substrate, which is coated with a photosensitive material (e.g., photoresist). The motion of the substrate during the duration of a flash is negligible. In the relatively long period between radiation pulses the pattern on the mirror array is advanced ("stepped") by a small increment corresponding to the movement of the substrate on the scanning stage, so that the pattern formed on the DMD array and the pattern formed on the substrate remain aligned. Hence, the designation "step-and-flash." Complete exposure of the DMD array pattern onto the substrate typically requires a significant number of flashes.

The '541 patent also discussed how a pattern written on a relatively fine grid could be accurately reproduced by a mirror array corresponding to a coarse grid, provided that the pattern can be modified slightly between successive partial exposures.

The basic scheme of the '541 patent has a number of advantages. Since the pattern moves across the micro-mirror array in many steps, an isolated defective micro-mirror (pixel) in the array has a minimal effect on the imaged pattern. This is because the contribution from the defective micro-mirror is outvoted by the remaining micro-mirrors used to represent this pattern element in the other exposures. For example, if 31 exposures are required for a pattern element to advance across the width of the micro-mirror array, then the diffraction-limited pattern element would be correctly represented by 30 exposures and would be distorted slightly by the defective micro-mirror in only one exposure. Furthermore, if a minimum feature in the pattern is represented by a 2 by 2 or 3 by 3 array of micro-mirrors, then the effect of an isolated defective mirror is reduced further by a factor of 4 or 9.

Another advantage of using multiple exposures of a micro-mirror array is that it affords the possibility of shifting the position of an edge between exposures. For example, with a single exposure, an edge position has to correspond to an edge boundary in the micro-mirror array. If these boundaries correspond to 50 nm increments on the substrate, then it is possible to write 100 nm and 150 nm lines but not 125 nm lines. Current mask pattern writing systems approximate a pattern laid out on a fine grid with a pattern on a coarse grid by choosing the edge on the coarse grid that is closest to the edge on the fine grid. This "edge popping" inevitably results in some distortion of the desired pattern. With multiple exposures it is possible to dither the edge position from one exposure to the next and more closely approximate the desired pattern.

By using 2 exposures and by shifting the position of an edge between exposures, it is possible to create a 125 nm line-width. Similarly, with 31 exposures it is possible to divide the mirror spacing by 31 or to achieve 1.6 nm line-width resolution capability and 0.8 nm line edge position resolution.

Generally, a very fine grid is used to represent the patterns required to manufacture an integrated circuit. For example, a 5 nm grid might be used to represent a circuit having a 100 nm minimum feature size. This allows incremental changes in feature size of only 5 nm. It is impractical to build a micro-mirror array corresponding directly to such a fine grid.

Most lithography projection optical systems are designed to be diffraction limited. When used with binary masks, such lens systems are able to resolve minimum features corresponding to about double the diffraction-limited size or those corresponding to a spatial frequency of $NA/\lambda$, where NA is the numerical aperture of the projection optical system, and $\lambda$ is the wavelength of exposure radiation used. If a minimum feature width (typically, $0.5\ \lambda/NA$) is formed using 2 or more mirrors in the micro-mirror array, then each of the mirrors is of a size ($0.25\ \lambda/NA$), which is equal to or smaller than the diffraction limit.

An image of an edge in a diffraction-limited imaging system is not infinitely sharp but rather has a gradual transition from full exposure to no exposure over a distance of about $\lambda/NA$. This is larger than the width of an individual micro-mirror sized at or below the diffraction limit of $0.25\ \lambda/NA$. Because of this effect, and because of the threshold nature of most photoresists used in lithography, multiple partial exposures can be superimposed with the pattern edge defined on the mirror array varying by as much as a mirror width with only a small but manageable effect on the edge slope of the resultant exposure. This shifts the resultant edge position on the substrate by an amount that is well approximated by the position of the edge averaged over the number of exposures. Thus, with a total of 31 partial exposures for example, a pattern edge can be positioned 7/31 of the distance between adjacent micro-mirror edges A and B by performing 7 exposures with the pattern image edge located at mirror edge A and with 24 exposures with the pattern image edge located at mirror edge B.

Despite the above-identified advantages of the system of the '541 patent, there is a significant drawback to the multiple-exposure approach. Namely, use of multiple exposures greatly increases the volume of data needed to program the DMD array to represent the pattern. For example, 31 exposures increases the amount of data needed to program the array by 31 times. Even with a single exposure, the data needed to represent a 22 mm by 22 mm pattern using a 50 nm-scale grid (i.e., 50 nm micro-mirror size) is an enormous $1.9 \times 10^{11}$ bits.

Thus, for the multiple-exposure approach to be applicable to image formation and printing applications involving large amounts of data, systems for and methods of storing transferring and displaying the data are needed.

SUMMARY OF THE INVENTION

The present invention relates to the generation and display of images or the recording of patterns compatible with using an image transducer. In particular the invention relates to a computer architecture for, and method of, generating and displaying images or recording patterns that exhibit line edge placement resolution to a fraction of the pixel size of the image transducer. The present invention is particularly applicable to the creation of high-resolution images and the patterning of substrates using maskless, step-and-repeat or maskless, step-and-flash lithography.

A first aspect of the present invention is a highly parallel data bus architecture for transferring n different patterns stored in n memory arrays into an image transducer. The symbol n represents an integer equal to or greater than 2. The n different patterns are combined so that the averaged result of $2^n-1$ partial exposures of the n different patterns is an image having a line placement accuracy of the image transducer pixel size divided by $2^n-1$. Each memory array contains a slightly different version of the pattern. For a visual image that might contain about 2 million pixels and require refreshment 30 times a second, the transfer of data from the n memories could be done in serial fashion for values of n as large as 4. However, a value of n=4 improves the line edge placement accuracy by a factor of 15, which, with conventional means, would require 225 times more pixels in the image transducer to obtain the same line edge placement accuracy. This improvement requires the transmission and storage of 4 pictures having coarse resolution. Thus the overall improvement in data transmission and storage is 225/4=56.25 for a value of n=4. This is a substantial improvement, making the technique of the present invention useful when it is desired that an image having high edge placement accuracy be transmitted efficiently over a channel with limited bandwidth or be displayed with an image transducer having relatively coarse pixel sizes.

Some applications, such as most visual applications, only a single image transducer is required. However most lithography applications involve huge data transfer rates and multiple image transducers are required. This invention spans both applications and although the principle of operations are generally described in terms of a single image transducer, it should be understood that the concept is readily expanded to cover an array of image transducers. Each image transducer is connected to multiple memory arrays storing different versions of the picture or pattern.

In most lithography applications the combination of very high line edge placement accuracy, relatively large picture area (field size), and high picture repetition rate requires a very efficient means of storing, transferring and displaying data. For example, a modem state-of-the-art lithography system might require a line edge position accuracy of 5 nm over a 22 mm by 22 mm field at a rate of 2 fields per second. Using a 5 nm by 5 nm pixel size would require a data rate of $3.87 \times 10^{13}$ pixels per second. This can be contrasted with using an image transducer pixel size that corresponds to ½ or ⅓ of the minimum feature size and then using multiple partial exposures of a few, coarse-resolution pictures to obtain the required line edge placement resolution. For example, a pixel size corresponding to 50 nm by 50 nm would provide 100 nm minimum feature sizes. Judicious use of 5 patterns would provide a line edge placement resolution of 50 nm/($2^5-1$)=50 nm/31=1.6 nm. This reduces the data volume for a complete image by 20 times and reduces the number of pixels required in the image transducer 100-fold.

The image transducer used in the present invention includes an array of microelements. In electrical communication with the array of microelements is a corresponding memory array referred to herein as the image transducer memory array. The image transducer memory array comprises a plurality of memory cells. Each microelement in the image transducer has a corresponding memory cell for storing a bit of pattern data that determines the microelements state ("on" or "off").

An aspect of the present invention is a computer architecture for facilitating the transfer of data to accomplish multiple-exposure imaging or printing. The architecture includes n memory arrays, where the integer n is equal to or greater than 2, and where each memory array is capable of storing a low-resolution pattern, all or part of which is used to form the pattern segment formed on the image transducer. The n patterns are preferably all slightly different versions of a single pattern and can be used to generate $2^n-1$ patterns, each corresponding to the $2^n-1$ partial exposures used to obtain a complete exposure of a pattern element. A parallel data bus electrically connects the n memory arrays to an image transducer memory array, and to one or more data bus switches determine which memory array is connected to the associated image transducer. A memory control unit is electrically connected to the n memory arrays and the data bus switches. The memory control unit is programmed differently depending on whether or not the partial exposures of the different patterns are combined statically, such as in a visual display or a step-and-repeat lithography application, or dynamically in a scanning lithography application. In a static application the pictures stored in memory are displayed sequentially, and are combined by the integrating properties of the eye or by partial exposures of a resist film. In a scanning application the memory control unit is programmed such that $2^n-1$ columns of pattern data stored in the n memory arrays are sequentially transferred to the $2^n-1$ memory cell columns of the image transducer memory array between clocking cycles. In this case each picture composed on the image transducer array contains picture elements from each one of the n memory arrays. Each pattern element traverses the image transducer in $2^n-1$ steps and is exposed with a series of $2^n-1$ radiation pulses. In the resulting $2^n-1$ partial exposures, every pattern element is completely exposed. Where necessary, such as in most lithography applications, a highly parallel date transfer architecture can be used to allow for the quick transfer of large amounts of pattern data to the image transducer memory array when forming an image with the image transducer.

Another aspect of the present invention is a lithography system for forming a high-resolution image from a plurality of sequentially exposed low-resolution patterns. The system includes, in order along an optical axis, a radiation source capable of generating a pulsed radiation beam, and a image transducer having an array of microelements capable of being in an on or off state. An exemplary image transducer is a DMD. The system further includes a projection system having an entrance pupil for receiving radiation reflected from the array of microelements when they are in the "on" state, an exit pupil and an image plane. The system also includes a movable substrate stage capable of supporting a substrate at or near the image plane and stepping or scanning the substrate during or after formation of the high-resolution image. The system further includes a memory and data bus controller electrically connected to the image transducer. The controller has the architecture described briefly above and in more detail below, and is used for controlling the transfer of pattern data from the n pattern memory arrays to the image transducer memory array during the time interval between exposure pulses.

BRIEF DESCRIPTION OF THE DRAWINGS

FIG. 7 is table showing how n similar patterns, represented by sentences written in different fonts, can be divided up and loaded into the memory associated with an image transducer used in a scanning system so that one of the patterns is partially exposed only once, the second twice, the third 4 times and so on, until the $n^{th}$ pattern is exposed $2^{n-1}$ times, while the pattern being formed is advanced in synchronism with a scanning stage;

DETAILED DESCRIPTION OF THE PRESENT INVENTION

The present invention relates to the generation and display of images or the recording of patterns for reconstruction using an image transducer, and in particular relates to a computer architecture for, and method of, generating and displaying images or recording patterns that exhibit line edge placement accuracy to a fraction of the pixel size of the image transducer.

In the description below, an "exposure" refers to the collection of radiation pulses (or "flashes" used to create a complete image of the final pattern to be formed on the substrate. A "field exposure" is an exposure used to cover an entire field, which usually contains one or more circuits on a semiconductor substrate. The term "pulse-exposure" refers to irradiation with a radiation pulse (or "flash"), so that an "exposure" and a "field exposure" both consist of more than one pulse-exposure. In other words, a pulse-exposure can be considered a partial exposure, and these terms are used interchangeably.

Further, an "image transducer" is a device having an array of microelements capable of being digitally programmed to form a (first) discrete pattern that can be projected using radiation to form an image or (second) pattern. Examples of an image transducer include DMDs and other known forms of spatial light modulators, as discussed below.

Also, "high resolution" in the present invention refers to the accuracy of the placement of an edge in an image as being a fraction of the width of a pixel or microelement used to form the pattern from which the image is created. Conversely, "low resolution" refers to edge placement accuracy substantially the same as or greater than the width of the aforementioned pixel or microelement.

Figure 1:
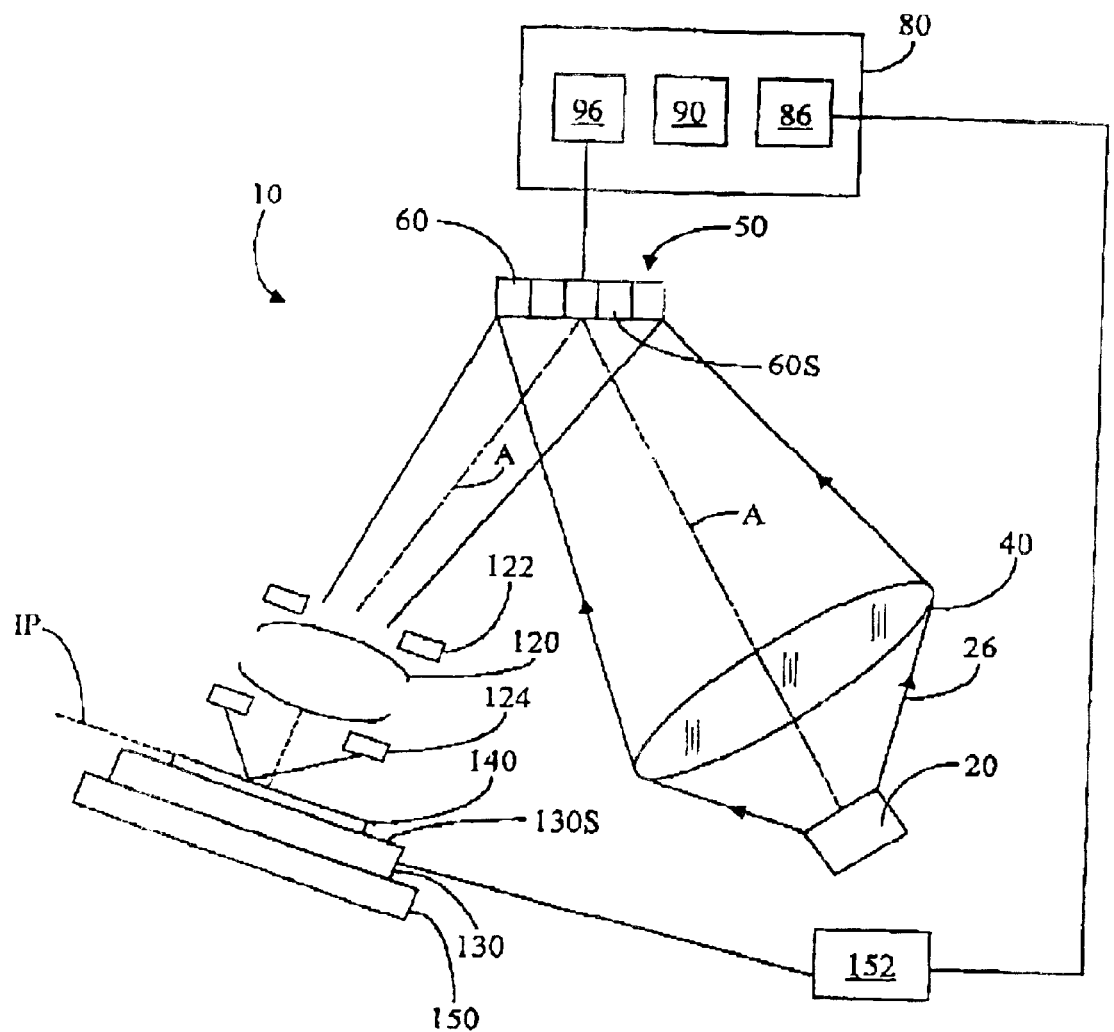
FIG. 1 is a schematic diagram of a step-and-flash or scan-and-flash lithography system employing a number of image transducers and the computer architecture of the present invention.

With reference to FIG. 1, a maskless step-and-flash lithography system 10 is now described. An exemplary system 10 adaptable for the present invention is described in detail in the '541 patent. Accordingly, the description of system 10 below is based on the system of the '541 patent.

System 10 includes, along an optical axis A, a radiation source 20 that produces, alone or in combination with other components, a pulsed radiation beam 26. Radiation beam 26 can be, for example, the pulsed output beam from an excimer laser, which has a relatively short temporal pulse length (e.g., 100 ns or less), and which can be pulsed at a high rate (e.g., in excess of 1000 Hz). Radiation source 20 can be also be any pulsed or strobed source of radiation, including lasers, flash lamps and light emitting diodes, so long as the radiation is compatible with the binary switching system of the image transducer and the projection optical system described below. Sources of infrared, visible, ultraviolet light, extreme ultraviolet light (EUV) can generally be used as radiation source 20 depending on the resolution required and the sensitivity of the recording medium (e.g., the resist-sensitivity spectrum).

System 10 further includes an illumination system 40, which typically includes relay lenses and/or mirrors and a homogenizer (e.g., a light pipe or fly's eye lens) (not shown) to improve the spatial uniformity of radiation beam 26, as well as define its cross-sectional area, direction, and degree of convergence when the beam emerges from the illumination system.

Figure 4:
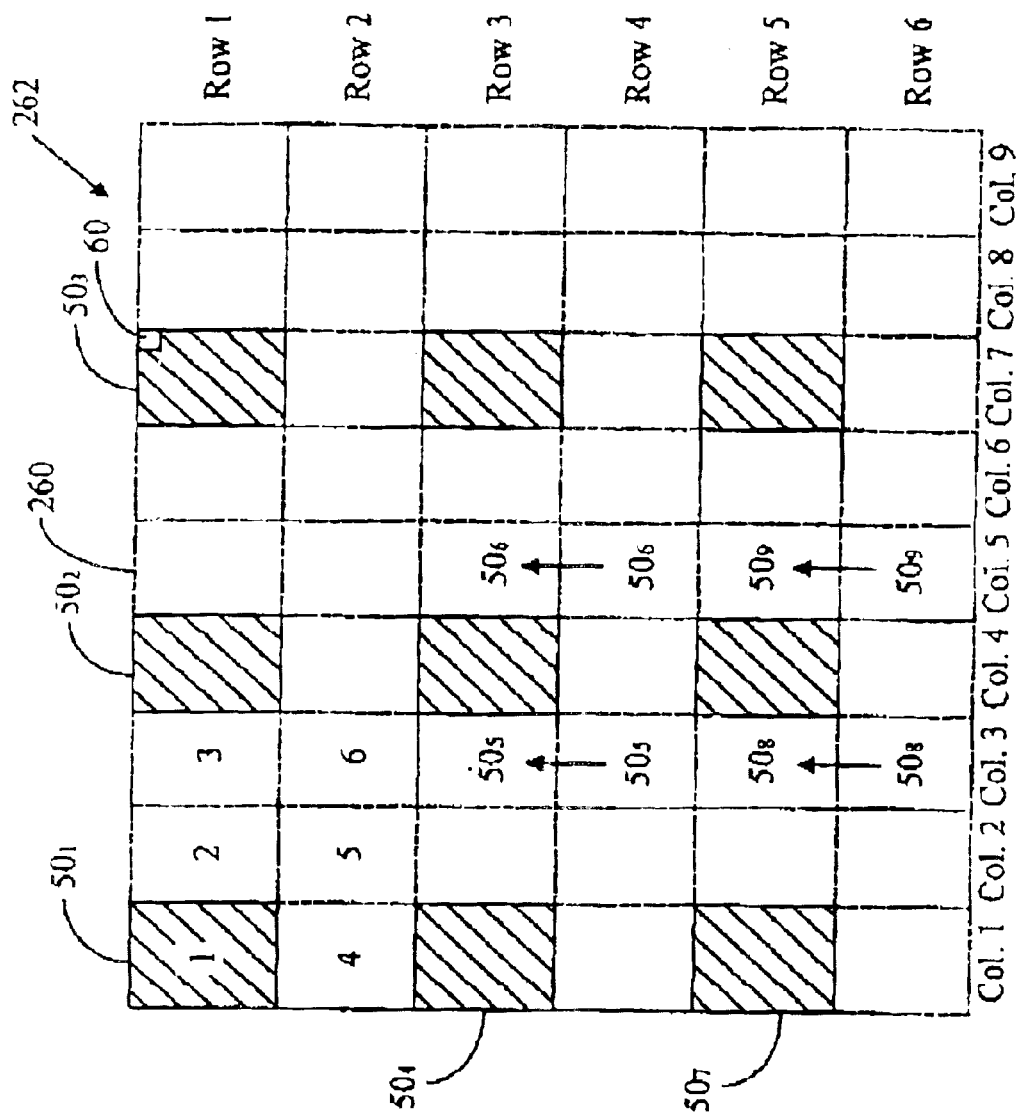
FIG. 4 is a schematic diagram of a sparse array of image transducers, which using a step-and-repeat sequence of 6 exposures could cover an extended area, that might be useful in a lithography application, wherein each of the six exposures could be made up of $2^n-1$ partial exposures using the procedure described in connection with FIGS. 3A–3D.
Figure 5:
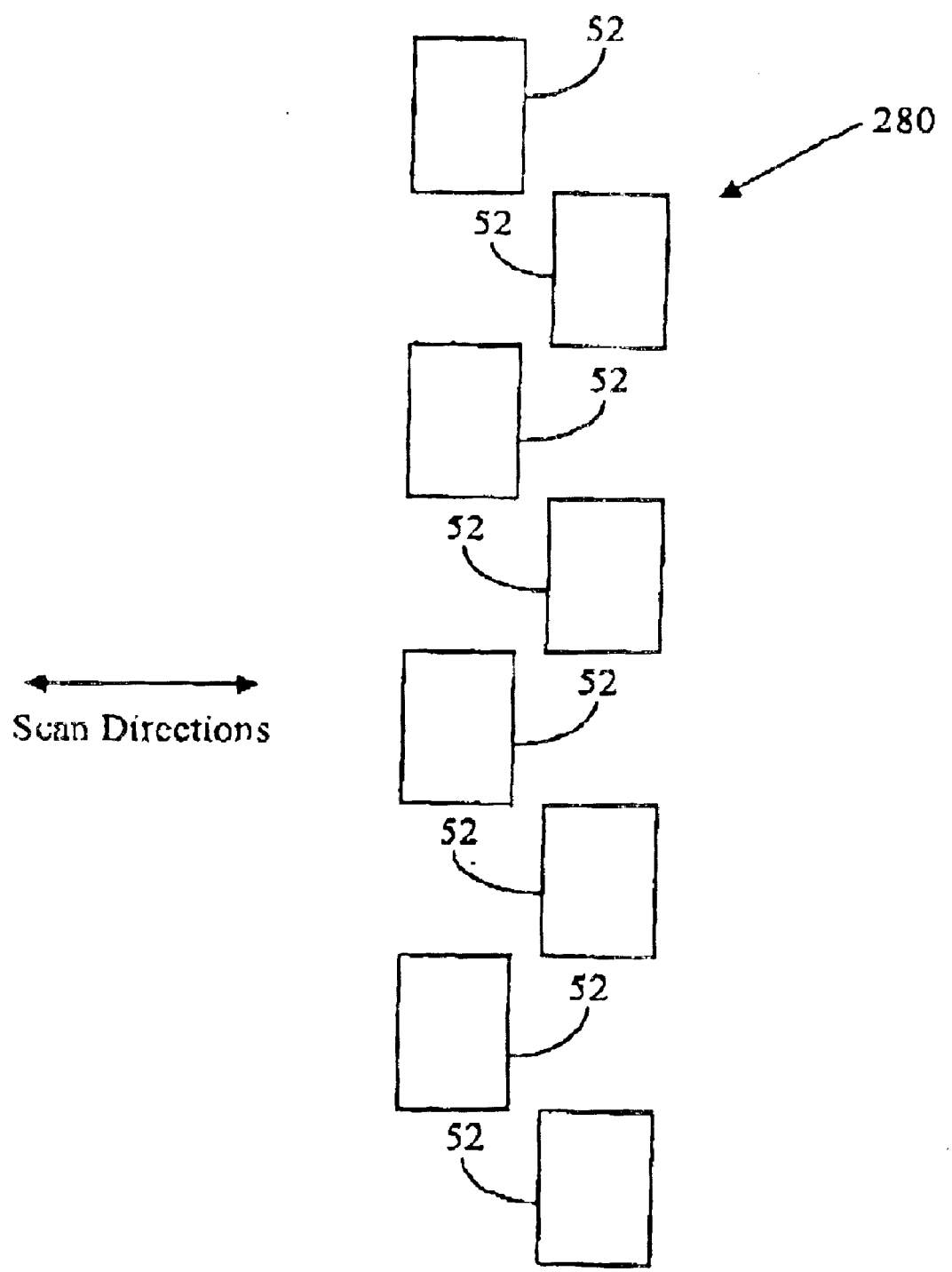
FIG. 5 is a schematic diagram of a staggered linear array of image transducers which, using the procedure described in connection with FIG. 3, can produce a high-resolution image equal to the length of the array and of arbitrary breadth.

System 10 also includes image transducer 50 having an array of microelements 60 that form a discretized planar reflective surface 60S. Microelements 60 are also referred to herein as "pixels." A preferred image transducer 50 is an array of DMDs, such as currently manufactured by Texas Instruments (TI) and as described in the Mignardi reference cited above. A plurality of image transducers 50 may be arrayed, as shown in FIG. 4 for a step-and-repeat configuration, or as shown in FIG. 5 for a flash-and-scan configuration as discussed below.

Figure 2:
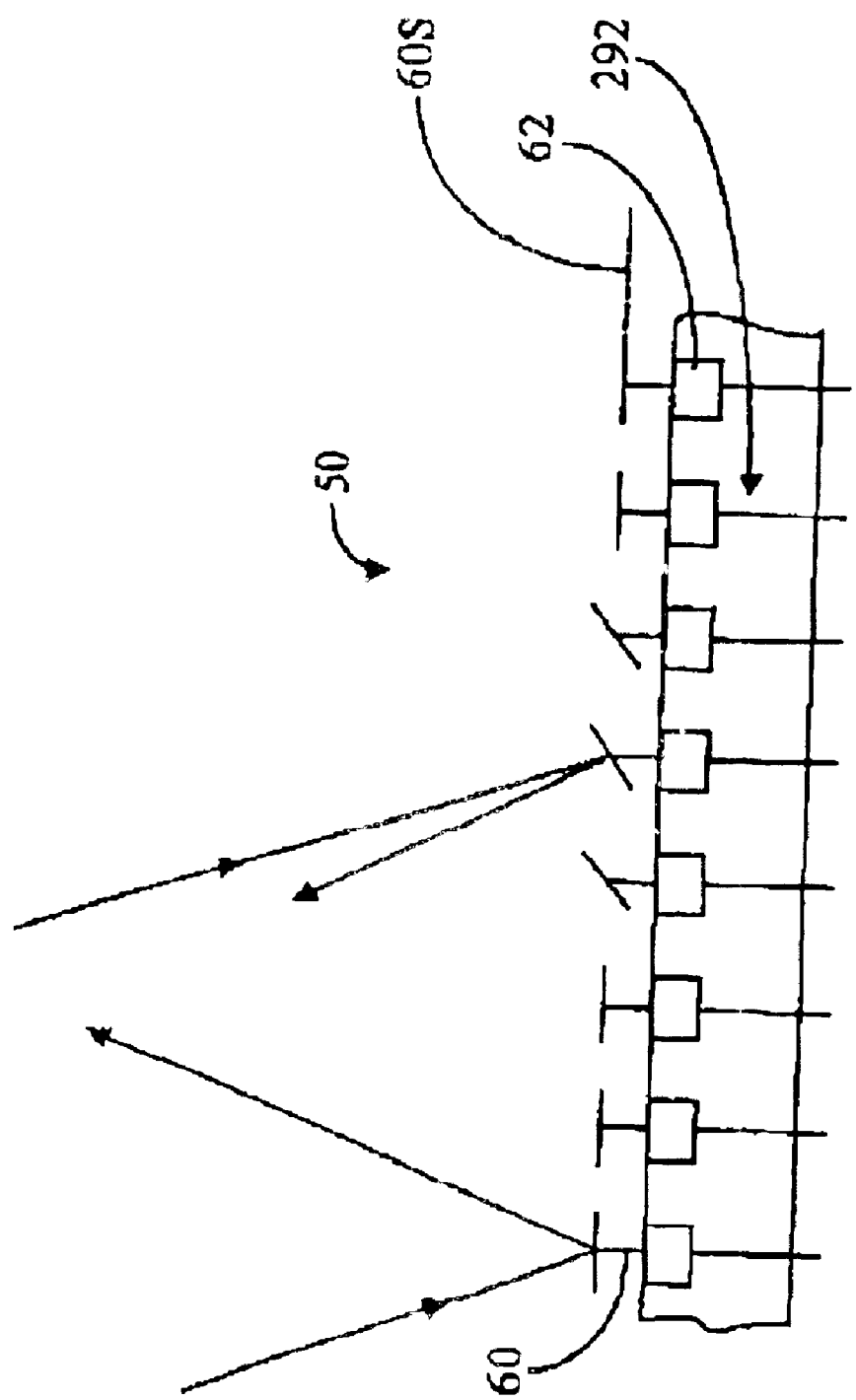
FIG. 2 is a cross-sectional view of a DMD device that constitutes an example of the image transducer of the system of FIG. 1, illustrating how radiation is reflected from the individual micro-mirror microelements making up the DMD.

With reference now to FIG. 2, a single, commercially available DMD may hold as many as 2 million microelements 60 in the form of micro-mirrors, with each micro-mirror being, for example, 16 microns square with a center-to-center spacing of 17 microns. A DMD mirror array, manufactured specifically for maskless lithography, might contain 256,000,000 or more micro-mirrors, with each micro-mirror being about one micron or less in size. Each micro-mirror can be independently deflected over a range of angular motion (e.g., from zero to a few degrees) with a fast settling time, (i.e., less than a microsecond).

Each microelement 60 is superimposed over a memory cell 62 containing a single bit of information that determines the micro-mirror orientation in one of two possible orientations ("on" or "off"). DMD memory cells 62 are organized so that the orientation of some fraction of an entire row or column of a micro-mirrors can be altered in a single memory clock cycle by transferring a block of data containing 1024 bits or more from a similarly organized memory array external to memory cells of the DMD. The DMD memory cells constitute a DMD memory array, or more generally, an image transducer memory array 292, discussed in greater detail below. The external memory array is also described in greater detail below.

Thus, image transducer 50 in the form of a DMD array serves as a programmable array of binary light switches, wherein a deflected micro-mirror corresponds to a dark portion of a desired pattern ("off" state), and an undeflected micro-mirror corresponds to a bright portion of the pattern ("on" state) or vice-versa. Using this protocol, a high contrast pattern can be programmed onto DMD array 50 in the time interval between "flashes" (pulses) of radiation source 20.

While a DMD array represents a preferred embodiment of image transducer 50 of present invention, it is just one example. Other programmable arrays and spatial radiation modulators can operate with sources of radiation other than visible or ultraviolet light. Such other sources of radiation include extreme ultraviolet (EUV), x-rays, and electrons and ions. Digitally programmable arrays may be based on arrays of mirrors, like the DMDs discussed above, on gratings, or on interference effects to provide switching at each element location. With further development, image transducers such as DMDs will have more and smaller microelements, and they will be much faster.

With reference again to FIG. 1, system 10 further includes an image transducer controller 80 (not necessarily located along optical axis A) that includes a memory control unit 86, a high-speed memory 90 electrically connected to the memory control unit, and a data bus switch 96 electrically connected to the high-speed memory. High-speed memory 90 may be, for example, a DRAM. Memory control unit 86 may be, for example, a CPU with a high clock rate. Data defining the patterns to be programmed onto image transducer 50 are stored in high-speed memory 90. This pattern data is transferred to image transducer 50 through data bus switch 96. Image transducer controller 80 is electrically connected to image transducer 50 and controls its operation. Image transducer controller 80 is described in greater detail below.

System 10 also includes a projection optical system 120 having an entrance pupil 122, an exit pupil 124, and an image plane IP. Adjacent projection optical system 120 is a movable scanning stage 130 having an upper surface 130S that supports a substrate 140 at or near image plane IP. Scanning stage 130 is supported by a platen 150. System 10 also includes a system controller 152 that is electrically connected to radiation source 20, to image transducer controller 80 and to scanning stage 130, for controlling the operation of these elements.

In general terms, system 10 operates as follows. System controller 152 activates radiation source 20, which causes pulsed radiation beam 26 to emanate from the radiation source. Radiation beam 26 enters illumination system 40, which uniformizes the radiation beam and adjusts the dimension and direction of the beam so that it is properly incident surface 60S of DMD array 50. Image transducer controller 80 controls the configuration of image transducer elements (e.g., micro-mirrors 60 in a DMD array) so as to form a desired binary pattern having relatively coarse resolution. The binary pattern so formed on image transducer 50 is illuminated at an angle by radiation beam 26 leaving illumination system 40. Microelements 60 in the "on" state act to direct incident radiation into projection optical system entrance pupil 122. Microelements 60 in the "off" state direct the incident radiation away from the projection optical system entrance pupil 122, and thus this microelement does not contribute to exposure of the corresponding portion of the substrate 140.

Thus, the pattern (or picture) programmed onto image transducer 50 at the time pulsed radiation beam 26 is incident surface 60S is the pattern that is imaged with projection optical system 120 onto substrate 140. Between radiation beam pulses, data corresponding to a new pattern may or may not be provided to image transducer 50, depending on the application. In most visual and step-and-repeat applications n patterns are combined with $2^n-1$ partial exposures or pulse exposures to form a complete image. In this case, some of the patterns are exposed multiple times before they are changed. In a scanning lithography application, the pattern on the image transducer must step in synchronism with the moving substrate and therefore this pattern is changed continuously. Blurring of the image due to motion of the substrate during the radiation pulse is generally negligible. For example, with a scanning stage velocity of 25 mm/sec, the distance traveled during a 30 ns pulse is a negligible 7.5 Angstroms.

As described in greater detail below, combining the multiple pulse-exposures of the patterns programmed onto image transducer 50 results in an image having an edge placement resolution that is a fraction of the width of a microelement 60 of the image transducer. This image can be recorded in a photosensitive recording medium such as a layer of photoresist formed atop substrate 140. Alternatively, the photosensitive recording medium can be a CCD array or other like device. Further, the high-resolution image can be formed and displayed on a viewing screen by combining (superimposing) the pulse-exposure images sufficiently fast (e.g., faster than the integration time of the human eye) so that only a single time averaged image is perceived.

System controller 152 is also coupled to, and coordinates the activation of, image transducer controller 80, which controls the pattern programmed onto image transducer 50, via memory control unit 86, by sending pattern data to the array between pulses. System controller 152 also controls the triggering of pulsed radiation beams 26 and the position of stage 130 so that the resultant image is sharp. The timing between the pulsed radiation beams (hereinafter, "pulses") must exactly correspond to the time it takes for a stage travel corresponding to $1/(2^n-1)$ the width of image transducer 50 in the scan direction or some portion thereof if the entire array making up the image transducer is not used.

Number of Pulses Per Exposure

In performing an exposure using multiple pulse-exposures, the present invention employs $2^n-1$ pulses per exposure, where n is an integer, typically 3, 4, 5, or 6 and a corresponding number of partial exposures, 7, 15, 31 or 63. Having $2^n-1$ partial exposures requires storing only n different patterns in high-speed memory 90 as different pattern data arrays, wherein the first pattern is pulse-exposed once, the second pattern is pulse-exposed twice, the third pattern is pulse-exposed 4 times, and so on until the last ($n^{th}$) pattern is pulse-exposed $2^{n-1}$ times. For n=5, the number of pulse-exposures is $2^n-1=32-1=31$ and the number of patterns that must be stored is 5.

The present invention includes a method of converting a binary pattern with edges on a fine grid into n binary patterns on a coarse grid that can be combined through $2^n-1$ partial exposures to form an image in a high-contrast photosensitive medium. The edge position resolution in the image so formed is equivalent to the coarse grid size divided by $2^n-1$.

Determining the n Different Coarse Patterns From an Idealized High-resolution Image With reference to FIGS. 3A–3D, the method of determining the n different coarse patterns to form an image with improved line edge placement accuracy is now described.

Figure 3A:
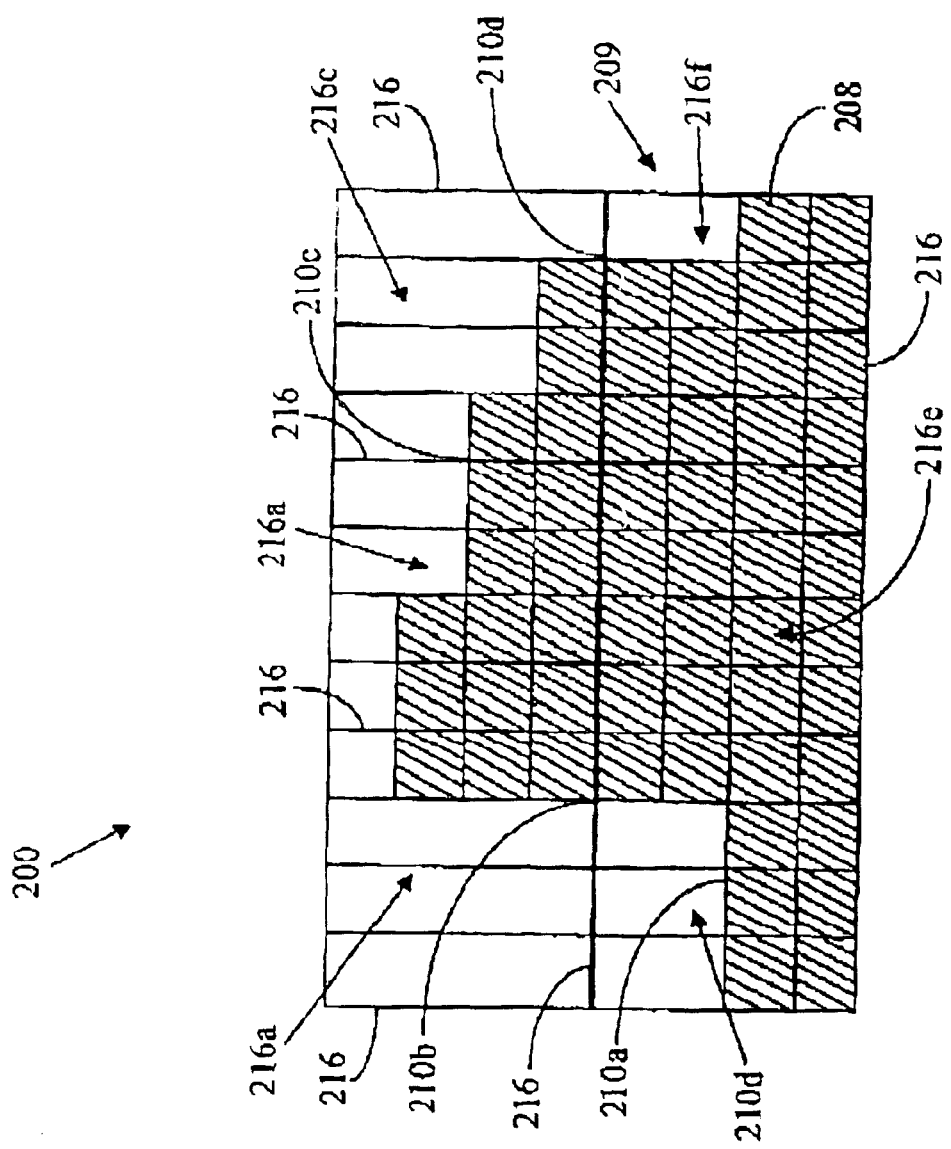
FIG. 3A is a schematic diagram illustrating how a desired high-resolution image is broken up into a fine grid pattern and overlaid with a coarse grid pattern.

With reference now to FIG. 3A, the method includes the steps of first, defining a fine grid pattern 200 comprising a plurality of fine grid pixels 208 for a desired idealized high-resolution image 209. For lithographic applications, image 209 typically relates to the design of an integrated circuit and is provided by a circuit designer. Fine grid pattern 200 has edge positions 210a–210d.

The next step in the method includes overlaying desired fine grid pattern 200 with a coarse pixel grid 216 and determining the proportion of exposed fine grid pixels 208 that make up the portion of desired high-resolution image 209 in each coarse-grid pixel. Fine-grid pixels 208 are defined by the size of the image transducer microelements 60.

Figures 3B, 3D:
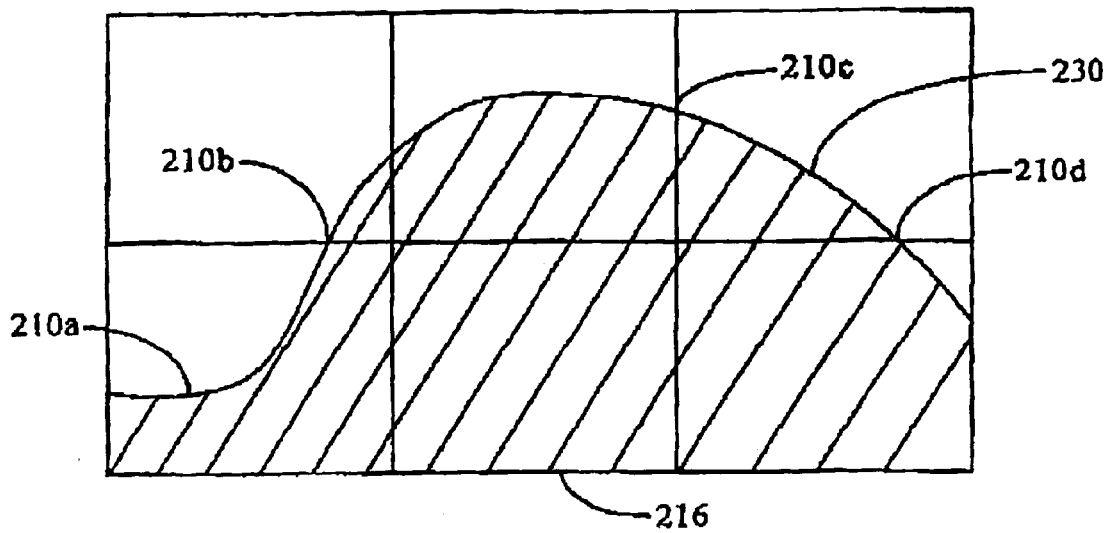
FIG. 3B is a schematic diagram illustrating the calculation steps used to determine the proportion of exposed, fine grid elements contained in each overlaying coarse grid element and how to convert this proportion into a binary number between zero and $2^n-1$.
FIG. 3D is a schematic diagram of the resulting high-resolution image formed by exposing the coarse grid patterns in accordance with FIG. 3C, showing the accurate edge location placement to within a fraction of a coarse grid pixel width (i.e., the width divided by $2^n-1$)

With reference now to FIG. 3B and the example shown therein, coarse-grid pixels 216a–216f contain 3, 10, 4, 10, 16 and 14 exposed, fine-grid pixels 208, respectively. Thus, in the next step of the method, the proportion p for each coarse grid pixels 216a–216f is determined, and in the present example is 3/16, 10/16, 4/16, 10/16, 16/16, and 14/16, respectively. The proportion p of each coarse grid pixel 216x, which is over-laid by exposed fine grid pixels 208, is then applied to the total number of exposures, assumed to be 31 in the example shown in FIG. 3B. The result is rounded to the nearest integer and the integer is converted to a binary number. Thus, each coarse grid pixel has an associated binary number N each binary digit of which dictates whether the coarse grid pixel is on or off in each of the n patterns containing that pixel. For coarse grid pixel 216a, the binary number N is 00110, which is the binary representation of the decimal number 6, using a binary notation with n=5 digits. Likewise, for coarse grid pixel 216e, N=11111, the five-digit binary notation for the decimal number 31.

A "1" in the unit column of the binary number N for a particular coarse grid pixel indicates exposure of this pixel in the first memory array. A "1" in the two's column of the binary number N indicates exposure of this pixel in the second memory array, and so on depending on the maximum length of the binary number. Generally, the total number of partial exposures is set to a number equal to $2^n-1$ where n is an integer. For example, with n equal to 3, 4, 5 or 6 the number of partial exposures would be 7, 15, 31 and 63 respectively. This also implies that the maximum size of the binary number will be n digits long and that n different memory arrays will be required to store the multiple versions of the coarse grid pattern. Each version of the pattern stored in the different memory arrays is typically similar, with the edge positions varying in some cases.

Figure 3C:
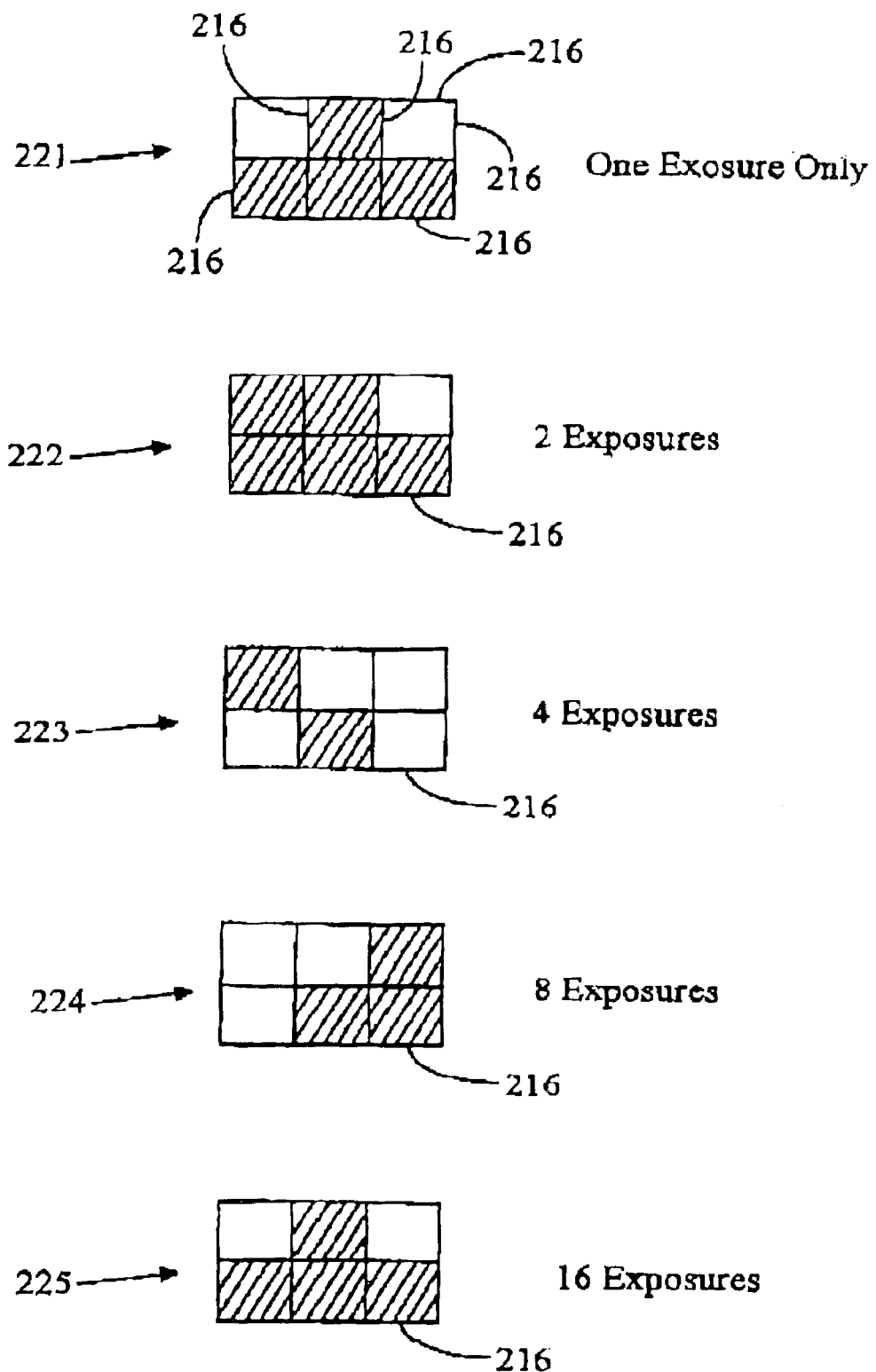
FIG. 3C is a schematic diagram of five different coarse grid patterns resulting from the calculation method illustrated in FIG. 3B and the fine pattern shown in FIG. 3A, showing the number of exposures required for each coarse grid pattern to obtain the desired high-resolution image.

FIG. 3C contains the 5 different patterns 221–225 that result from fine pattern 200 of FIG. 3A with n=5. The patterns stored in the n different memories are employed in such a way that the first memory pattern 221 is partially exposed once, the second memory pattern 222 is partially exposed twice, the third memory pattern 223 is partially exposed 4 times, and so on until the $n^{th}$ pattern is exposed $2^{n-1}$ times (e.g., for n=5, the nth memory pattern is exposed 16 times). Note that, for coarse pixel 216a, in patterns 221–225, this pixel is off-on-on-off-off, respectively. This exposure pattern corresponds in binary to 00110, which is the binary number 6 calculated above for the number of exposures needed for this coarse pixel in order to form the idealized high-resolution image 209.

The resulting high-contrast resist pattern resulting from the 31 partial exposures of the 5 patterns 221–225 shown in FIG. 3C is illustrated in FIG. 3D as pattern 230. Pattern 230 is the result of superimposing the images of the different patterns 221–225 with each pattern weighted according to the number of times each pattern is exposed. The high frequency components (i.e., edges) of fine grid pattern 200 are lost, since they correspond to spatial frequencies much higher than those transmitted by projection lens 120 (FIG. 1); however, edge positions 210a–210d are accurately reproduced, and in fact, are located to within a fraction of the width of a coarse pixel 216x.

To a first order approximation, if the desired pattern edge location is a fraction x coarse grid pixels away from one nearest coarse grid boundary 216 then $(x-1)(2^n-1)$ exposures will be made with the edge at boundary 216 and $x(2^n-1)$ exposures will be made with the edge at the coarse grid edge boundary 216 on the other side of the desired edge location of the pattern.

For example, if the desired position of an edge in the desired imaged pattern to be formed on substrate 140 happens to correspond to an edge of one of microelements (e.g., micro-mirrors 60) in image transducer 50, then the position of that edge would be the same in each pattern. If the desired edge position in the desired image is 1/31 of a micro-mirror width away from a microelement edge, then the first pattern, which is pulse-exposed only once, would have the edge positioned on the micro-mirror edge farthest away (30/31 microelement widths) from its desired location. The other patterns would have their edge positioned on the microelement edge closest to its desired image location. The combination of $2^n-1$ pulse-exposures places the average position of the edge image where it is desired.

Similarly, if the desired edge position is 15/31 of a microelement width away from one of the microelement edges, then the edge would be located on one edge boundary in the patterns corresponding to 1, 2, 4, and 8 pulse-exposures for a total of 15 pulse-exposures, and on the adjacent edge boundary in the pattern corresponding to 16 pulse-exposures. This yields an average position in the image for the exposed edge that is the desired 15/31 of a microelement width away from the referenced boundary.

The procedure described above can be modified to adjust the number of pulse-exposures of each pattern to compensate for a variety of optical effects. These optical effects include the slight nonlinearity between the actual edge position achieved in high-contrast photoresist and the calculated edge position averaged over $2^n-1$ pulse-exposures, and optical proximity effects. Regarding the latter, the procedure can be modified to adjust the n patterns in the regions surrounding a corner in the fine grid pattern to compensate for the rounding of corners and the shortening narrow lines. These modifications can be accomplished via computer modeling or done empirically.

FIG. 4 shows a sparse image transducer array of nine transducers $50_x$ that might be used to produce an image in a step-and-repeat lithography system. Each image transducer element 50 might contain a 20,000 by 15,000 element array of pixel (micro) elements 60, each about 1 micron square. When imaged onto substrate 140 by a 20× reduction projection lens 120 (see FIG. 1), each microelement 60 corresponds to a pixel that is 50 nm square, and each image transducer element 50 covers a 1 mm by 0.75 mm area. The entire sparse transducer array of FIG. 4 would fit easily inside the field of a modestly sized projection lens.

The sparse transducer array of FIG. 4 in position 1 as shown, covers a first subfield 260 consisting of columns 1 through 7 and rows 1 through 5. Next the array of FIG. 4 is stepped to position 2 with transducer $50_1$ in the col. 2, row 1 position; transducer $50_2$ in the col. 5, row 1 position; transducer $50_3$ in the col. 8, row 1 position; transducer $50_4$ in the col. 2, row 3 position; transducer $50_5$ in the col. 5, row 3 position; transducer $50_6$ in the col. 8, row 3 position; transducer $50_7$ in the col. 2, row 5 position; transducer $50_8$ in the col. 5, row 5 position; and transducer $50_9$ in the col. 8, row 5 position, thus defining a second subfield consisting of columns 2 through 8 and rows 1 through 5.

Next the array of FIG. 4 is stepped to position 3 with transducer $50_1$ in the col. 3, row 1 position; transducer $50_2$ in the col. 6, row 1 position; transducer $50_3$ in the col. 9, row 1 position; transducer $50_4$ in the col. 3, row 3 position; transducer $50_5$ in the col. 6, row 3 position; transducer $50_6$ in the col. 9, row 3 position; transducer $50_7$ in the col. 3, row 5 position; transducer $50_8$ in the col. 6, row 5 position; and transducer $50_9$ in the col. 9, row 5 position, thus defining a third subfield consisting of columns 3 through 9 and rows 1 through 5.

Next the array of FIG. 4 is stepped to position 4 with transducer $50_1$ in the col. 1, row 2 position; transducer $50_2$ in the col. 4, row 2 position; transducer $50_3$ in the col. 7, row 2 position; transducer $50_4$ in the col. 1, row 4 position; transducer $50_5$ in the col. 4, row 4 position; transducer $50_6$ in the col. 7, row 4 position; transducer $50_7$ in the col. 1, row 6 position; transducer $50_8$ in the col. 4, row 6 position; and transducer $50_9$ in the col. 7, row 6 position, thus defining a fourth subfield consisting of columns 1 through 7 and rows 2 through 6.

Next the array of FIG. 4 is stepped to position 5 with transducer $50_1$ in the col. 2, row 2 position; transducer $50_2$ in the col. 5, row 2 position; transducer $50_3$ in the col. 8, row 2 position; transducer $50_4$ in the col. 2, row 4 position; transducer $50_5$ in the col. 5, row 4 position; transducer $50_6$ in the col. 8, row 4 position; transducer $50_7$ in the col. 2, row 6 position; transducer $50_8$ in the col. 5, row 6 position; and transducer $50_9$ in the col. 8, row 6 position, thus defining a fifth subfield consisting of columns 2 through 9 and rows 2 through 6.

Next the array of FIG. 4 is stepped to position 6 with transducer $50_1$ in the col. 3, row 2 position; transducer $50_2$ in the col. 6, row 2 position; transducer $50_3$ in the col. 9, row 2 position; transducer $50_4$ in the col. 3, row 4 position; transducer $50_5$ in the col. 6, row 4 position; transducer $50_6$ in the col. 9, row 4 position; transducer $50_7$ in the col. 3, row 6 position; transducer $50_8$ in the col. 6, row 6 position; and transducer $50_9$ in the col. 9, row 6 position, thus defining a sixth subfield consisting of columns 3 through 9 and rows 2 through 6.

Thus the array of nine transducers $50_x$ of FIG. 4, when stepped and exposed six times (steps 1–6) to fill the blank spaces between the sparse array transducers $50_x$ in each step, covers a 6 mm by 6.75 mm area (cols. 1–9 and rows 1–6) of field 262. This field size is large enough to contain a substantial portion of the commercial semiconductor chips, since these chips could include gates as small as 0.1 microns. Therefore a step-and-repeat type system employing a sparse array of image transducers can well prove to be suitable for certain commercial chip making applications and for mask making; however throughput might be limited by the time taken to perform the multiple steps and expose 6 times to cover one full field 260. Problems caused by imperfect butting of images from different exposures can be ameliorated by tapering the exposures at the edges of each transducer and by slightly overlapping adjacent exposures.

Figure 6A:
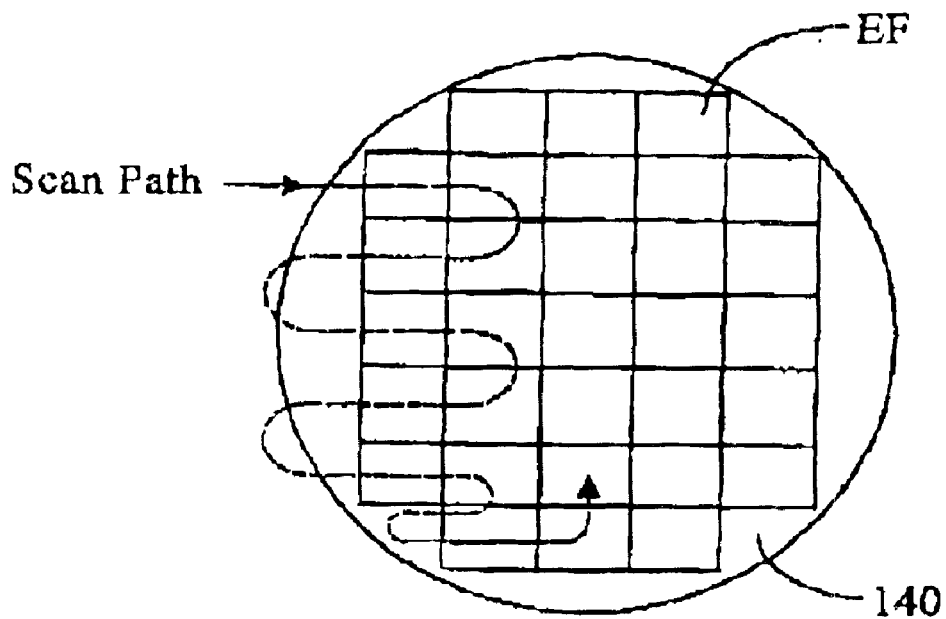
FIGS. 6A and 6B are plan views of a substrate and its respective exposure fields illustrating the comparison of the scanning path for a conventional step-and-scan lithography system (FIG. 6A) and the scanning path for a "scan-and-flash" lithography system (FIG. 6B)
Figure 6B:
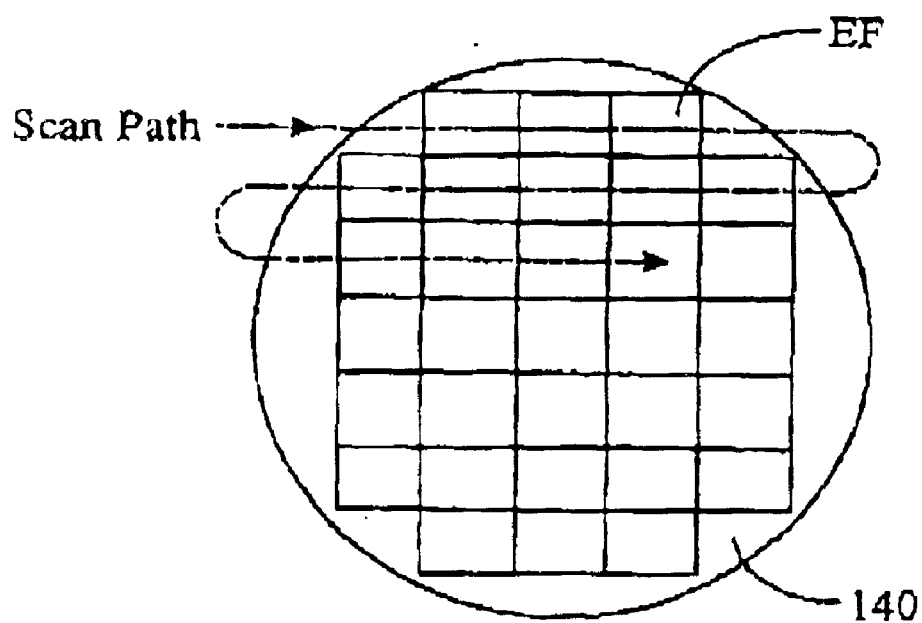

Better printing efficiency can be obtained by employing a linear array, or possibly a staggered linear array, of image transducers elements 52 that cover a long narrow length of a predefined exposure field and which can be continuously scanned from one side of the substrate to the other. Such an array 280 is illustrated in FIG. 5. The scan path used to image fields 260 over substrate 140 is illustrated in FIG. 6B. Exposure fields on substrate 140 are indicated by EF. The efficiency and simplification afforded by this approach is apparent by comparing the substrate scan path for a "scan-and-flash" system (FIG. 6B) to that of a conventional "step-and-scan" system, shown in FIG. 6A.

In a preferred aspect of the present invention, the images from the multiple field exposures in a step-and-repeat system are butted together to form a contiguous printed image larger than an image of the image transducer. Further, the field exposures are tapered at the edge of the image transducer and are overlapped slightly to ensure a contiguous printed image having no abrupt discontinuities caused by stepping errors.

Ensuring the Requisite Number of Partial Exposures in a Scanning System

One of the complications of a scanning imaging system is ensuring the requisite number of partial exposures for each of the n patterns while at the same time stepping the pattern across the image transducer to ensure that the various partial exposures are correctly superimposed. This can be done by dividing the image transducer into $2^n-1$, equally sized columns in a direction normal to the scan direction and always filling the first column from the first pattern stored in memory, the next 2 columns from the second pattern stored in memory, the next 4 columns from the third pattern and so on until all n patterns fill all $2^n-1$ columns.

Figure 7:
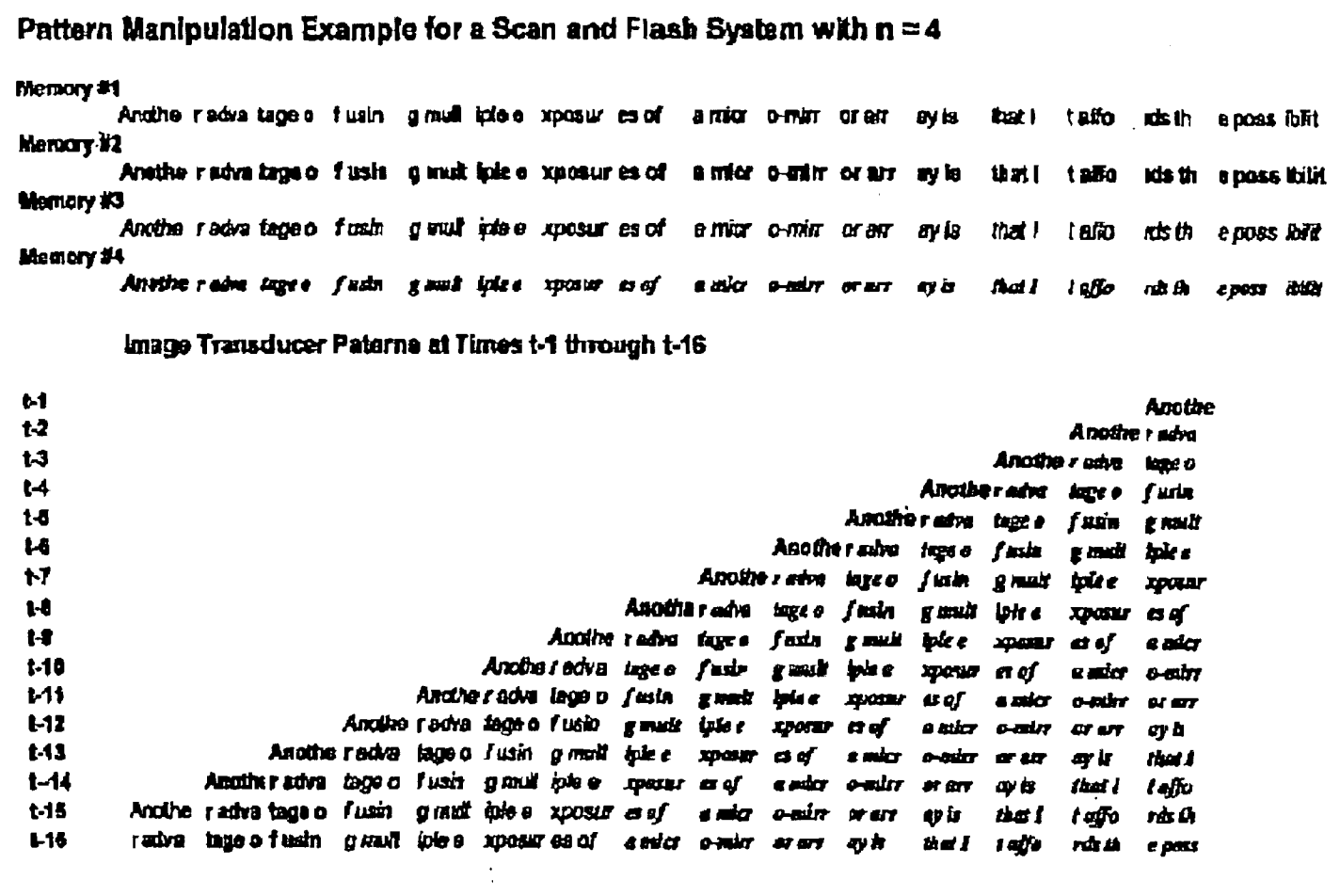

In order to display a complete portion of a pattern, it is necessary to place consecutive portions of the pattern in adjacent columns of the image transducer and to increment the portion of the pattern stored after each pulse-exposure. This approach is illustrated in FIG. 7, which uses several sentences to represent a "pattern," and 6 letters to represent a column width. Small differences between the patterns, stored in the 4 pattern memories (M1 through M4 in FIG. 8*l*), are represented by the use of different fonts. The contents of the image transducer are represented by "rows" (or, "horizontal columns") t-1 through t-16. Prior to the first pulse-exposure, the first column of memory #4 is loaded into column t-15 of the image transducer memory array. Similarly, prior to the second pulse-exposure, the two columns are loaded into the columns t-14 and t-15 of the image transducer memory array. This continues through the $8^{th}$ pulse-exposure, whereupon column 1 of memory #3 is loaded into column t-7 of the image transducer memory array. The process continues through 3 more iterations until 4 of the image transducer memory array columns are filled from data from memory #3 and then 2 columns are added from memory #2 and finally 1 column from memory #1 after 15 iterations. At t-16 the image transducer contains the second column from memory #1, the third and fourth columns from memory #2, the fifth through the $8^{th}$ column from memory #3, and the ninth through the $16^{th}$ column from memory #4.

Figure 8:
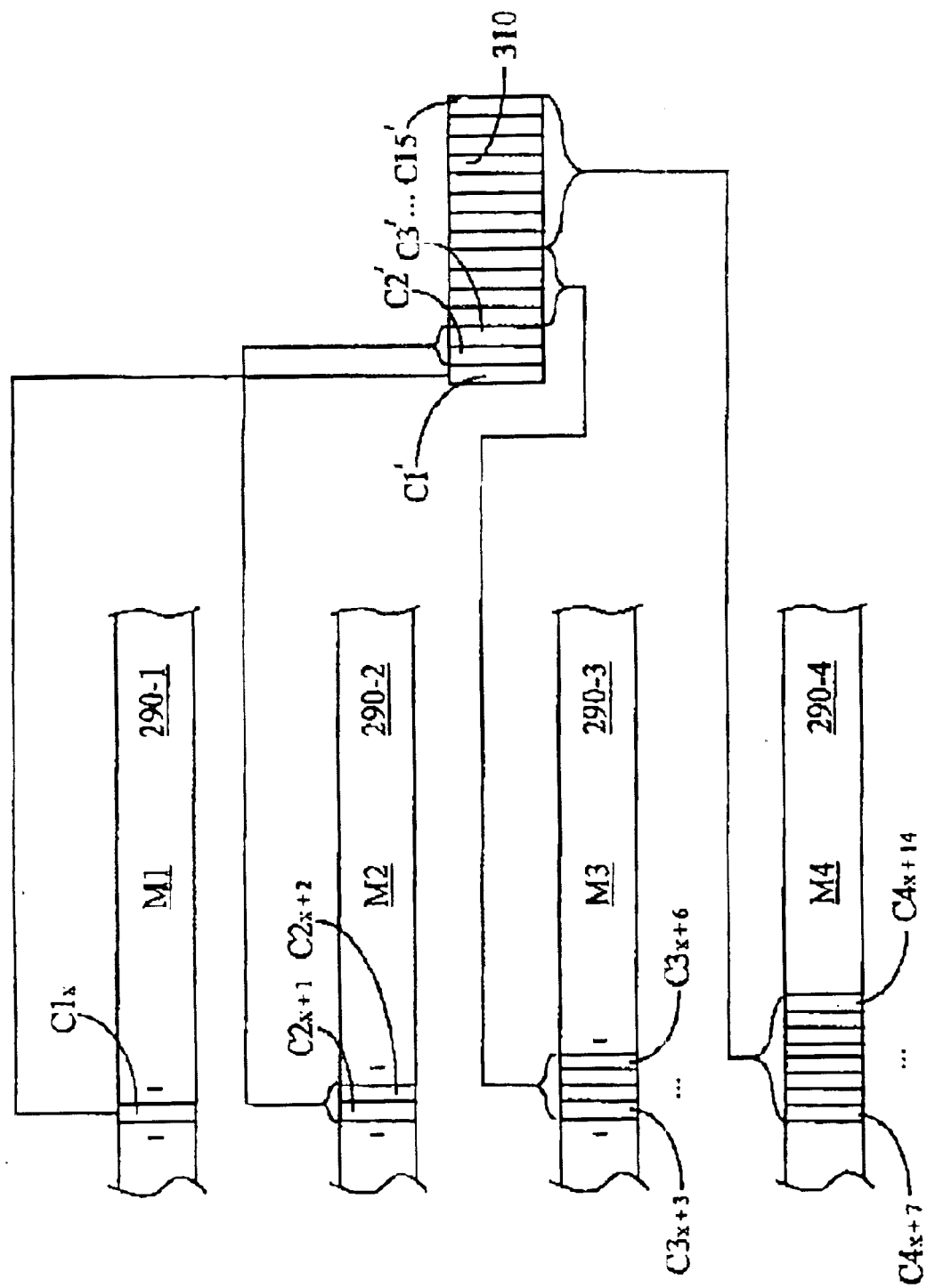
FIG. 8 is a schematic diagram showing how 4 different patterns can be divided into equal-sized columns and loaded into an image transducer memory array so that one of the patterns is partially exposed only once, the second twice, the third 4 times and so on, until the 4th pattern is exposed 8 times.

Casual inspection of FIG. 7 shows that 8 of the image transducer memory array columns are dedicated to pattern columns from memory #4, 4 from memory #3, 2 from memory #2 and 1 from memory #1. It is also apparent how the pattern advances one column with every pulse-exposure. The transfer of information from the pattern memories M1 through M4 (n=4) into an image transducer having 15 columns is illustrated in FIG. 8, described in greater detail below.

Data Path Architecture and Transfer Method

Figure 9:
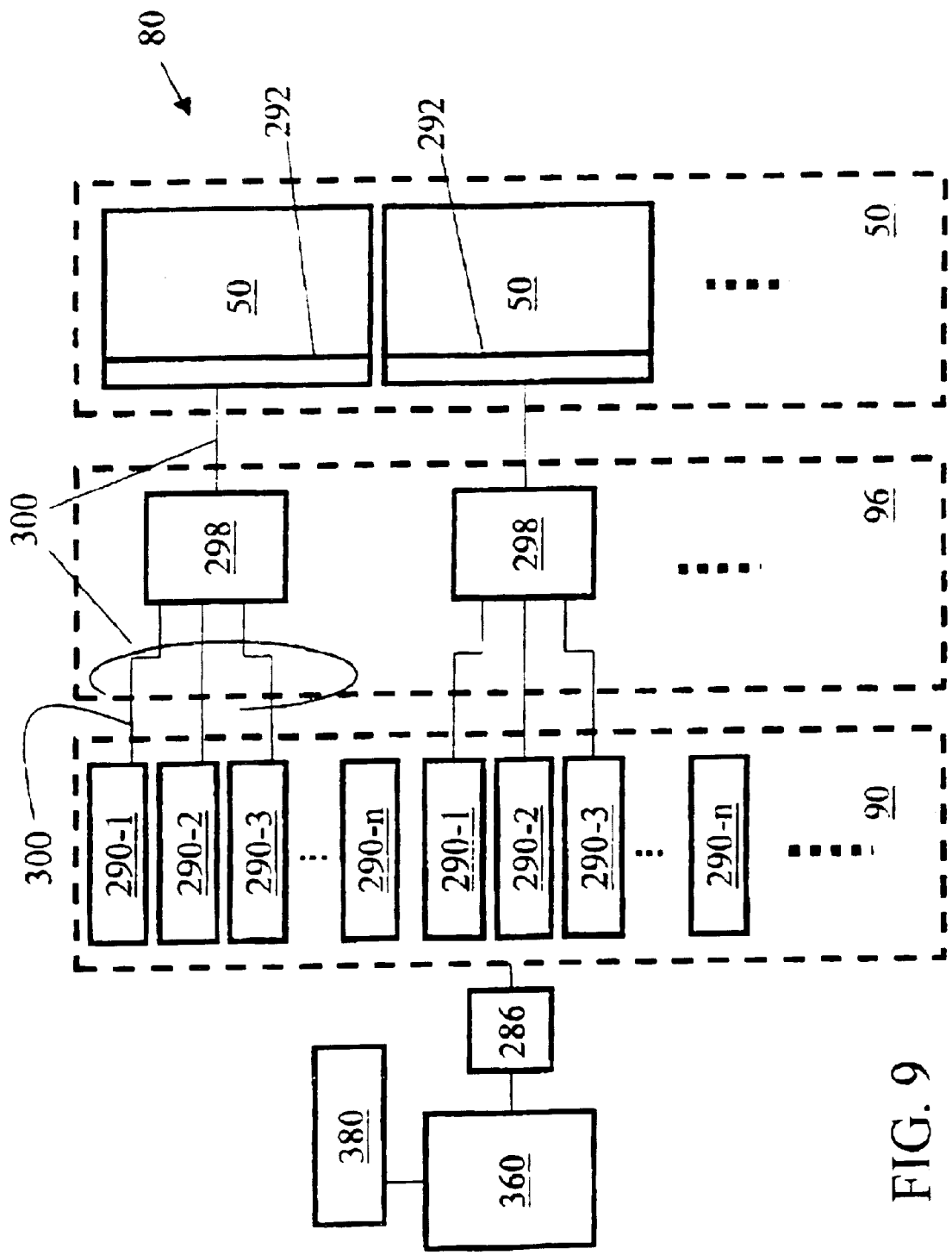
FIG. 9 is a detailed schematic diagram of the computer system and data path architecture for programming the image transducers of FIG. 1 so that the line edge placement resolution of the exposed image is better than that provided by a single exposure of the image transducer array.

FIG. 9 shows the pattern data storage configuration and data path architecture used to efficiently transfer pattern data from high-speed memory 90 to a group of image transducer elements 52 using an array of data switches 96 so that the pattern locked into each image transducer element before each pulse-exposure advances in synchronism with the scanned substrate. A control unit 286 also ensures that the n different versions of the pattern stored in the high-speed memory are each used to compose part of the pattern contained in each image transducer element 52. The method of transferring the pattern onto the image transducer is now described.

As mentioned above, high-speed memory 90 is preferably a rapid-access memory medium, such as one or more DRAMS or SRAMS, and includes, for each image transducer element 52, a total of n separate memory arrays (or blocks) 290-1 to 290-n that store the n different versions of the pattern data. A small portion of this data is used to compose the portion of the pattern contained in each image transducer element at any instant of time. Data bus switch array 96 comprises one or more data bus switches 298 that control the transfer of pattern data stored in memory arrays 290-1 to 290-n to memory cells 62 making up a image transducer memory array 292 for each image transducer element 52. Memory arrays 290, data bus switch array 96 and image transducer memory array 292 in electrical communication with image transducer microelements 60 (FIG. 2) are all electrically interconnected by a high-speed, highly parallel data bus 300.

In order to achieve the pixel printing rates of modern lithography systems, it is necessary to operate the pattern data transfer process at a high clock rate and to transfer many bits of information with each cycle. Thus, for most lithography applications, data bus 300 needs to be at least 256 bits wide and preferably 1000 bits wide. System 10 can have as many as 10 or 20 or more image transducer elements 52, and the data transfer into each image transducer memory array 292 must be done concurrently. This highly parallel data transfer is accomplished in the present invention by the data path architecture of FIG. 9 and the algorithm described above in connection with FIGS. 7 and 8 for transferring data from memory arrays 290-x to image transducer memory arrays 292.

If the pattern data is designed to form a high-resolution image over a field of 22 mm by 22 mm with a pixel size of 50 nm, then each of the n memory arrays 290-1 to 290-n associated with each image transducer element 52 holds $19.36 \times 10^{10}$ bits. This is clearly much larger that the 256 M bit capacity of a conventional image transducer element, such as a DMD. Accordingly, at any instant of time, image transducer 50 displays only a narrow slice of a complete pattern.

Referring again to FIG. 8, each image transducer memory array 292 contains some of the pattern data from each of the 4 pattern memory arrays 290-1 through 290-4 for that image transducer element. The preferred arrangement for manipulating the pattern data in this fashion is shown in FIG. 7 for the case of n=4, as discussed above. For n=4, 15 "strips" (e.g., columns 310) of pattern data are stored in image transducer memory array 292; one of which comes from memory array 290-1 (e.g., memory M1), two of which come from memory array 290-2 (e.g., memory M2), four of which come from memory array 290-3 (e.g., memory M3) and eight of which come from memory array 290-4 (e.g., memory M4).

With continuing reference to FIG. 8, and assuming that each image transducer element 52 contains 256 M microelements 60 (e.g., micro-mirrors 60 of FIG. 2), then each data column 310 in image transducer memory array 292 contains about 256 M/15=16 M bits (possibly arranged as 516 bits by 32 k bits). Between each radiation pulse, the pattern data in image transducer memory array 292 has to be changed (e.g., "stepped" or "shifted") so the pattern programmed onto image transducer 50 shifts to correspond to the motion of substrate stage 130.

Assume now that each memory array 290-1 through 290-4 in FIG. 8 has a large number of data columns C1 through C4, respectively. In the case of memory array 290-1, only one data column $C1_x$ is contributed to the image transducer memory array 292. At some arbitrary time $t_x$, column $C1_x$ is transferred to a first column C1' in the image transducer array. In the same time interval, data columns $C2_{x+1}$ and $C2_{x+2}$ from memory array 290-2 are placed in columns C2' and C3' of image transducer memory array 292, along with data columns $C3_{x+3}$ through $C3_{x+6}$ into columns C4' through C7' of the image transducer memory array 292 and data columns $C4_{x+7}$ through $C4_{x+14}$ into columns C8' through C15' of the image transducer memory array. Thus, all 15 columns C1'–C15' of the image transducer memory array 292 are filled with adjacent parts of the image pattern stored in all 4 of the associated pattern memories M1–M4.

After the pulse-exposure, x is incremented by one unit and the process repeats, thus shifting the pattern by one column corresponding to the motion of the substrate. Once the entire pattern has been run through image transducer memory array 292, it is followed by a few blank frames to provide a scribe alley. The pattern is repeated until the edge of substrate 140 is reached. At this point, the scan direction is reversed and the position of the substrate is adjusted in the cross-scan direction so that another row of exposure fields EF can be printed. This is illustrated by the scanning trajectory illustrated in FIG. 6B.

By modifying the flow of information from high-speed memory 90 to image transducer 50, it is possible to create the same image by scanning in the reverse direction. This procedure is preferably repeated until the entire substrate 140 is covered with images, whereupon the exposed substrate is exchanged for an unexposed one. The scanning pattern used to expose an entire substrate is illustrated in FIG. 6B. This scanning arrangement is very efficient since very little time is spent stopping or changing direction. This is in sharp contrast to a step-and-repeat system, in which the step and settle time of the substrate stage constitutes a major portion of the total process time. It is also a considerable improvement over a step-and-scan system that typically requires a change in mask scanning direction with every field.

Referring again to FIG. 9, image transducer memory array 292 is connected to each of the n memory arrays 290 by a highly parallel bus 300. For example, a 256 M image transducer element organized as an 8 k by 32 k array could be connected to each memory array 290 by data bus lines 300 containing 2,048 parallel wires. This allows 2,048 bits of information to be transferred in every clock cycle of memory control unit 86. With radiation source 20 operating at 4 MHz, the memory clock rate would need to be above 512 MHz in order to transfer all the pattern data from memory arrays 190 to image transducer memory arrays 292 in the time interval between radiation source pulses.

In a preferred embodiment of the present invention, raw data describing the patterns to be formed on image transducer 50 are input to the high-speed memory arrays 290 via a high-speed communication channel that connects to a data archive 360, such as an array of hard disks. This data can be stored in the same format as it is used or it can be compressed. In the latter case, it needs to be expanded into n digital images by a data preparation computer 380 in electrical communication with data archive 360 prior to its transfer to high-speed memory arrays 290.

The data path architecture of the present invention solves, in a unique way, the problem of connecting image transducer elements to memory arrays in a manner that supports the incredibly high pixel transfer rates required in modern lithographic systems, and in a flash and scan lithographic system in particular.

Exemplary Lithographic Systems

Table 1, below, lists exemplary parameters for two different systems 10 of the present invention as described above.

TABLE 1

SYSTEM PARAMETERS

| Parameter Description | SYSTEM 1 | SYSTEM 2 |
|---|---|---|
| Minimum Feature Size at Image Plane | 0.1 microns | 0.1 microns |
| Pixels per Min. Feature Size | 2 | 2 |
| SIZE | | |
| DMD Array | 16k × 64k | 8k × 32k |
| DMD Size | 8 mm × 32 mm | 8 mm × 32 mm |
| Reduction Ratio | 10:1 | 20:1 |
| Pulse Rate of radiation Source | 2 kHz | 4 kHz |
| Number of pulses per exposure (n = 5) | 31 | 31 |
| Scan Speed | 51.6 mm/s | 51.6 mm/s |
| DMD Bus Lines | 4k | 2k |
| Data Clock Rate | 600 MHz | 600 MHz |
| Data Rate/image transducer element | $2.4 \times 10^{12}$ bits/sec | $1.2 \times 10^{12}$ bits/sec |
| Field Size | 22 × 22 mm | 22 × 22 mm |
| Number of image transducer elements in image transducer | 7 | 14 |
| System Data Rate | $16.8 \times 10^{12}$ bits/sec | $16.8 \times 10^{12}$ bits/sec |
| Total Pattern Storage REQUIREMENTS | $9.68 \times 10^{11}$ bits | $9.68 \times 10^{11}$ bits |
| Number of 1 G DRAMs Required | 968 | 968 |
| Edge Placement Resolution | 1.6 nm | 1.6 nm |
| Throughput for 200 mm Diameter Substrates | ~70/hr | ~70/hr |

System 10 of the present invention may be utilized for the fabrication of micro-devices such as magnetic heads used in disk drives and magnetic tape storage systems, or microelectronic devices such as memory devices, microprocessors, microcontrollers and specialized ASIC devices. The system can also be used to fabricate microelectromechanical (MEMS) devices such as accelerometers, sensors, and ink jet heads, or flat panel display structures such as active matrix liquid crystal displays.

The many features and advantages of the present invention are apparent from the detailed specification, and, thus, it is intended by the appended claims to cover all such features and advantages of the described apparatus that follow the true spirit and scope of the invention. Furthermore, since numerous modifications and changes will readily occur to those of skill in the art, it is not desired to limit the invention to the exact construction and operation described herein. Accordingly, other embodiments and equivalents are within the scope of the appended claims.

What is claimed is:

1. A method of forming an image having edge placement accuracy to a small fraction of a pixel using an image transducer having coarse pixels, the method comprising the steps of:

a) defining a fine grid pattern comprising a plurality of fine-grid pixels corresponding to a desired image;

b) overlaying the coarse grid pixel array on the fine grid pattern and determining a proportion p of the number of exposed fine grid pixels making up the portion of the fine grid pattern formed in each coarse grid pixel;

c) applying the proportion p to a number of pulse-exposures ($2^n-1$) to be combined to obtain an n-digit binary integer number N corresponding to each coarse-grid pixel;

d) creating n different binary patterns based an the binary numbers N, wherein the pattern number is based on the order of the digit starting from the right and whether or not the pixel is exposed depends on whether the digit is a one or a zero; and e) imaging the n patterns in sequence by pulse-exposing an $m^{th}$ pattern $2^{m-1}$ times for a total of $2^n-1$ pulse-exposures, thereby forming a set of superimposed images having an edge placement resolution substantially equal to the width of a coarse grid pixel divided by ($2^n-1$).

2. A method according to claim 1, wherein said step e) includes the step of recording the superimposed image in a high-contrast photosensitive medium.

3. A method according to claim 1, wherein said step e) includes the step of displaying the superimposed image such that it appears to the eye as a single time-averaged image.

4. A method according to claim 1, wherein said step d) includes modifying the n binary patterns to compensate for image edge position errors arising from optical proximity effects and/or the non-linearities in the edge profile of a diffraction limited image.

5. A method according to claim 1, wherein said step d) includes the step of defining each coarse-grid pixel as "on" or "off" for each pulse-exposure based on the sequence of binary digits, 1s and 0s in the associated binary number N, so that if the first digit is N is a one, the corresponding pixel is exposed in the first binary pattern, and it the second digit in N is a zero then the corresponding pixel is unexposed in the second binary pattern, and so on.

6. A method according to claim 1 of performing step-and-repeat lithography, further including the steps of:
   i) storing the n different binary patterns in corresponding memory arrays in electrical communication with the image transducer; and
   ii) recording the superimposed image in a high-contrast photosensitive medium covering a substrate by stepping-and-repeating multiple field exposures, where each field exposure consists of $2^n-1$ partial exposures and the field exposures are butted together on the substrate to form a contiguous printed image covering an area larger than the image of the image transducer.

7. A method according to claim 6, wherein in step i) the field exposures are tapered at the edge of the image transducer, and in step ii) the fields are overlapped slightly to ensure a contiguous printed image having no abrupt discontinuities caused by small stepping errors.

* * * * *